(12) United States Patent
Shieh et al.

(10) Patent No.: US 9,069,249 B2
(45) Date of Patent: Jun. 30, 2015

(54) SELF ALIGNED PATTERNING WITH MULTIPLE RESIST LAYERS

(71) Applicant: Taiwan Semiconductor Manufacturing Company, Ltd., Hsin-Chu (TW)

(72) Inventors: Ming-Feng Shieh, Yongkang (TW);
Ken-Hsien Hsieh, Taipei (TW);
Shih-Ming Chang, Zhubei (TW);
Chih-Ming Lai, Hsinchu (TW);
Ru-Gun Liu, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 134 days.

(21) Appl. No.: 13/757,137

(22) Filed: Feb. 1, 2013

(65) Prior Publication Data
US 2014/0220493 A1 Aug. 7, 2014

(51) Int. Cl.
*G03F 7/20* (2006.01)

(52) U.S. Cl.
CPC ........................................ *G03F 7/20* (2013.01)

(58) Field of Classification Search
CPC ........................................................... G03F 7/20
USPC .................................................. 430/313, 314
See application file for complete search history.

(56) References Cited

U.S. PATENT DOCUMENTS

| 8,012,674 B2 * | 9/2011 | Fischer et al. ................ 430/314 |
| 2012/0208361 A1 * | 8/2012 | Ha ............................... 438/597 |

* cited by examiner

*Primary Examiner* — Kathleen Duda
(74) *Attorney, Agent, or Firm* — Haynes and Boone, LLP (57) ABSTRACT

A method for using self aligned multiple patterning with multiple resist layers includes forming a first patterned resist layer onto a substrate, forming a spacer layer on top of the first patterned resist layer such that spacer forms on side walls of features of the first resist layer, and forming a second patterned resist layer over the spacer layer and depositing a masking layer. The method further includes performing a planarizing process to expose the first patterned resist layer, removing the first resist layer, removing the second resist layer, and exposing the substrate.

18 Claims, 7 Drawing Sheets

SELF ALIGNED PATTERNING WITH MULTIPLE RESIST LAYERS

BACKGROUND

When fabricating integrated circuits, various features such as metal lines are formed into and onto a semiconductor substrate. To form these features, photo-masks are used to form a pattern into a photo-resist layer. The regions where the photo-resist layer is removed expose the underlying substrate to an etching process used to form trenches where metal is subsequently placed.

As the patterns formed into photo-resist layers become increasingly dense, it becomes difficult to use a single photo-mask to form a pattern in the photo-resist layer because features within the nanometer range are smaller than the resolution of a light source to which the photo-resist layer is exposed. Thus, multiple masks may be used to form the features within a pattern. Specifically, each of the multiple masks is used to create different features within the final pattern.

When multiple masks are used to form a single pattern, it is important that the masks are aligned properly so that various errors may be avoided. For example, it is problematic if two adjacent features, each from a different mask, are formed too close to each other. Such errors may cause short circuits or bad circuit connections.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the disclosure. Specific examples of components and arrangements are described below to simplify the present disclosure. These are, of course, merely examples and are not intended to be limiting. Moreover, the performance of a first process before a second process in the description that follows may include embodiments in which the second process is performed immediately after the first process, and may also include embodiments in which additional processes may be performed between the first and second processes. Various features may be arbitrarily drawn in different scales for the sake of simplicity and clarity. Furthermore, the formation of a first feature over or on a second feature in the description that follows may include embodiments in which the first and second features are formed in direct contact, and may also include embodiments in which additional features may be formed between the first and second features, such that the first and second features may not be in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

Figure 1A:
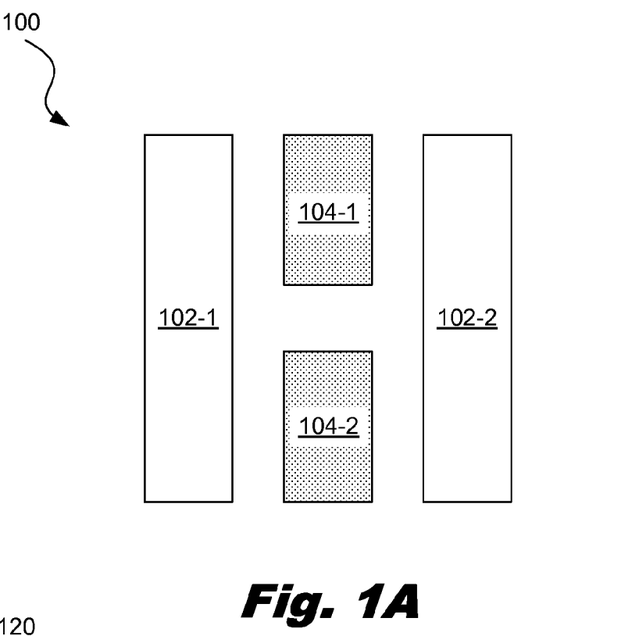
FIGS. 1A-1B are diagrams showing illustrative multiple patterning, according to one example of principles described herein.
Figure 1B:
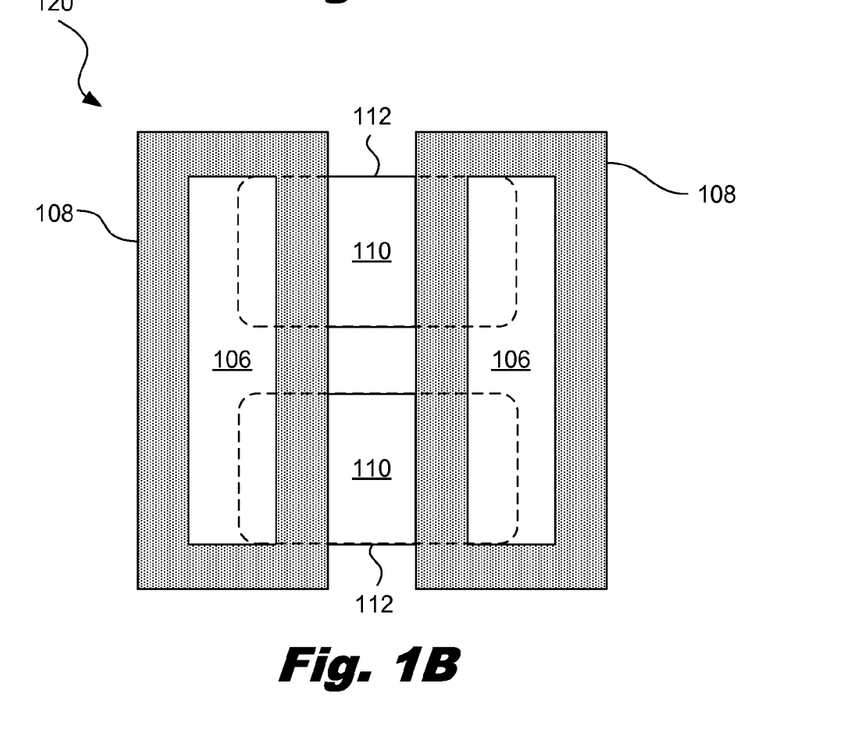

FIGS. 1A-1B are diagrams showing illustrative multiple patterning 100. As mentioned above, as the density of integrated circuits increases, some features may be too close together for the resolution of a photo-mask. To overcome this issue, the features of the pattern can be assigned to two or more masks.

FIG. 1A illustrates features 102 assigned to a first mask and features 104 assigned to a second mask. In this example, feature 102-1 is too close to features 104-1 and 104-2. Thus, a single photo-mask would not be able to form such a pattern. By putting features 104-1 and 104-2 on a second mask, the appropriate pattern can be formed onto a photo-resist layer. When patterning the features 104 assigned to the second mask, it is important that they are aligned properly so as not to come too close to the features 102 formed by the first mask.

FIG. 1B is a diagram showing an illustrative top view 120 of self aligned patterning. According to the present example, the features 106 assigned to the first mask are formed first. A spacer 108 material is then formed on and around the features 106. This spacer 108 ensures that other features cannot be placed within a specific distance from the features 106. For example, features 110, shown in phantom, are from a second mask. The features 110 assigned to the second mask can be deposited on top of the substrate and the spacer. Thus, any alignment or overlay error will not bring the second mask features 110 unacceptably close to the features 106 from the first mask. As a result, the features 110 will form the features 104, shown in FIG. 1A. The following describes this self alignment process in further detail.

Figure 2A:
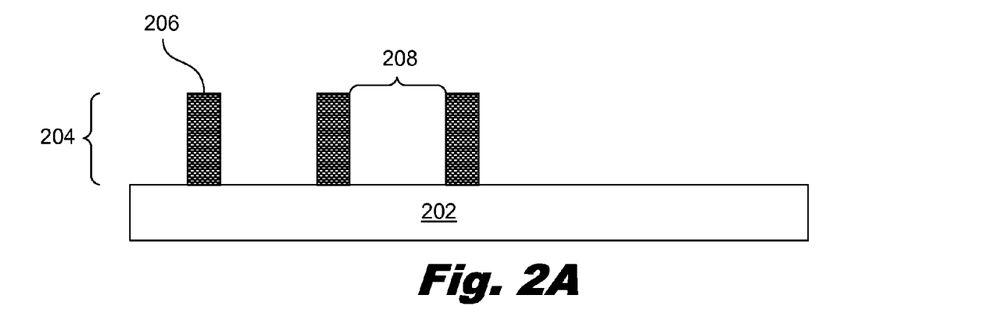
FIG. 2A-2H are diagrams showing an illustrative process for forming an integrated circuit using self aligned patterning with similar mask tone types, according to one example of principles described herein.

FIG. 2A-2H are diagrams showing an illustrative process for forming an integrated circuit using self aligned patterning in which the two masks used to form two resist layers have the same type of tone. FIG. 2A illustrates features 206 of a first patterned resist layer 204 being formed. According to the present example, various features 206 are formed onto a substrate 202. In one example, the features are formed using standard photolithographic techniques. Specifically, a photo-resist layer is deposited onto the substrate 202. A mask is used to expose certain regions of the resist layer to a light source. If the mask used is a bright field mask, then the regions of the mask that block the light source define the features 206. A space 208 between features 206 that is exposed to the light source becomes soluble to a developing solution and is removed.

Figure 2B:
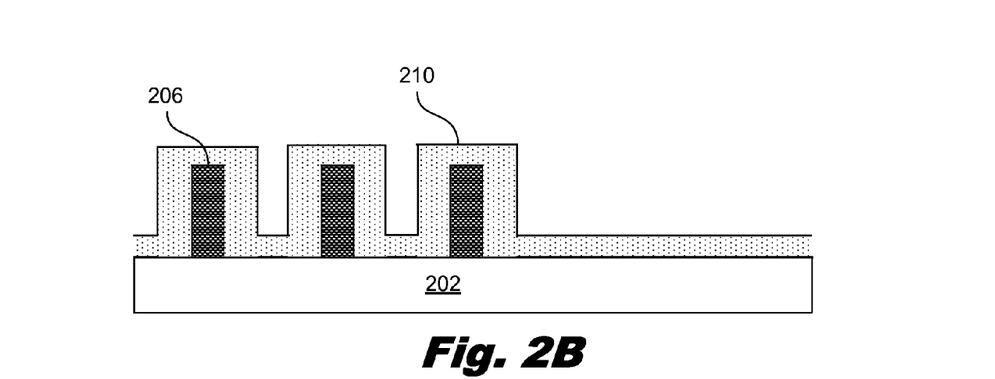

FIG. 2B illustrates the deposition of a spacer layer over the substrate 202. The spacer material is formed on the top and side walls of the features 206. Because the features 206 are used to support the spacer layer, the first patterned resist layer may be referred to as a mandrel layer. Various commonly used spacer materials may be used in accordance with principles described herein. The spacer layer may be made from a variety of materials including, but not limited to, oxide, silicon nitride (SiN), titanium nitride (TiN), titanium dioxide ($TiO_2$), aluminum oxide ($Al_2O_3$), and tantalum nitride (TaN).

The thickness of the spacer material 210 may be based on the critical dimension of the pattern. A critical dimension defines the minimum length of a particular dimension that is deemed critical based on error tolerance. For example, the critical dimension may be the space between two adjacent metal lines. The minimum space between the two lines may be defined by a set of rules that are made to reduce errors in the integrated circuit fabrication process to a tolerable level. By setting the spacer thickness to at least the critical dimension distance, it can be ensured that subsequently deposited features do not violate the rules related to the critical dimension. Moreover, as will be discussed further below, a higher degree of overlay error can be tolerated.

Figure 2C:
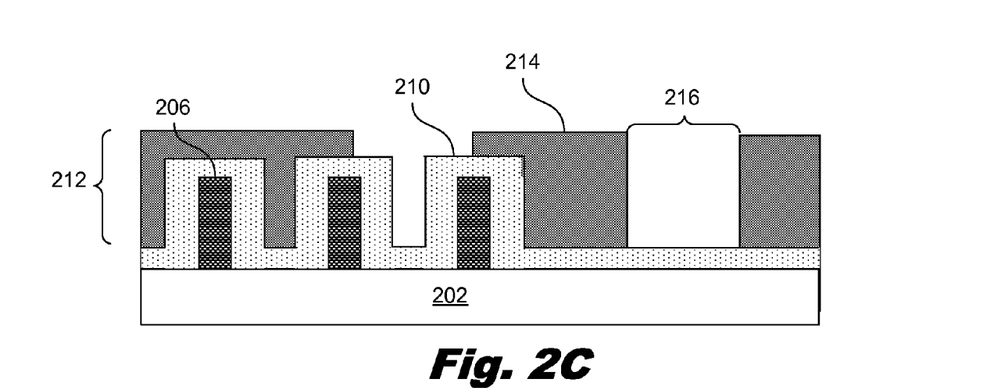

FIG. 2C illustrates the deposition of a second patterned resist layer 212. According to the present example, features of the final pattern are defined by the features 214 of the second patterned resist layer 212. The final pattern refers to the pattern that results from both the first mask and the second mask. In this example, the mask for the second resist layer 212 is the same type of tone as the mask for the first resist layer 204. Thus, features of the final pattern are defined by features of both the first resist layer 204 and the second resist layer 212. As is illustrated, the features 214 of the second patterned resist layer 212 may overlap the spacer layer and even the features 206 of the first patterned resist layer 204. The overlap will not adversely affect the intended final pattern. Thus, a larger alignment error between the masks that form the resist layers 204, 212 may be tolerated.

The second patterned photo-resist layer may be made from a variety of standard photo-resist materials. For example, the second patterned photo-resist material may be a tri-layer that includes a bottom layer resist, a middle layer resist, and a top layer resist. The bottom layer may be a Bottom Anti-Reflective Coating (BARC) layer. The middle layer may be made of silicon and is used as a hard mask. The ArF immersion resist can be used for immersion lithographic patterning.

Figure 2D:
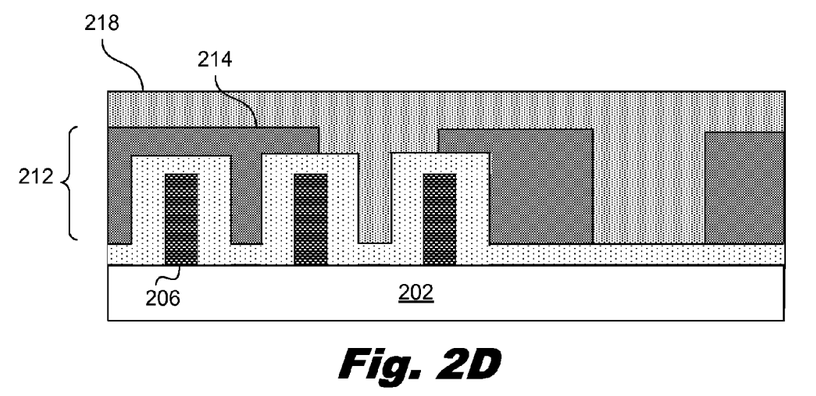

FIG. 2D illustrates the deposition of a masking layer 218. The masking layer 218 may be a standard hard mask material. For example, the masking layer material may be an ALD-Oxide material. The masking layer 218 fills in the spaces between the features 214 of the second resist layer 212.

Figure 2E:
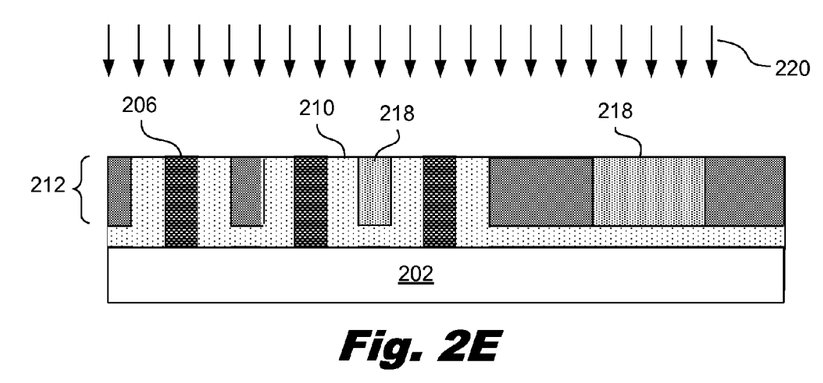
Figure 2F:
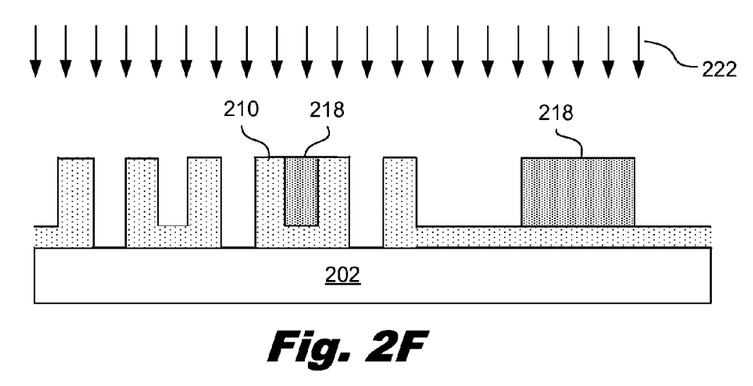

FIG. 2E illustrates a planarizing process 220 to grind away at each layer until the features of the first resist layer 204 are exposed. The planarizing process may be, for example, a Chemical Mechanical Polish (CMP) process. After such a process, the features of the second resist layer 212, certain regions of the spacer material 210, and certain regions of the hard mask layer 218 will be exposed. FIG. 2F illustrates a removal process 222 to remove the resist layers 204, 212. Specifically, the removal process 222 selectively removes the resist material that forms the first resist layer and the resist material of the second resist layer 212. The removal process does not, however, remove the spacer layer material 210 or the masking layer material 218 To remove the first resist layer material 204, a dry etch process may be used. If the first resist layer material 204 is made of a carbon material, then a O2/N2H2 ash may be used to remove the material.

Figure 2G:
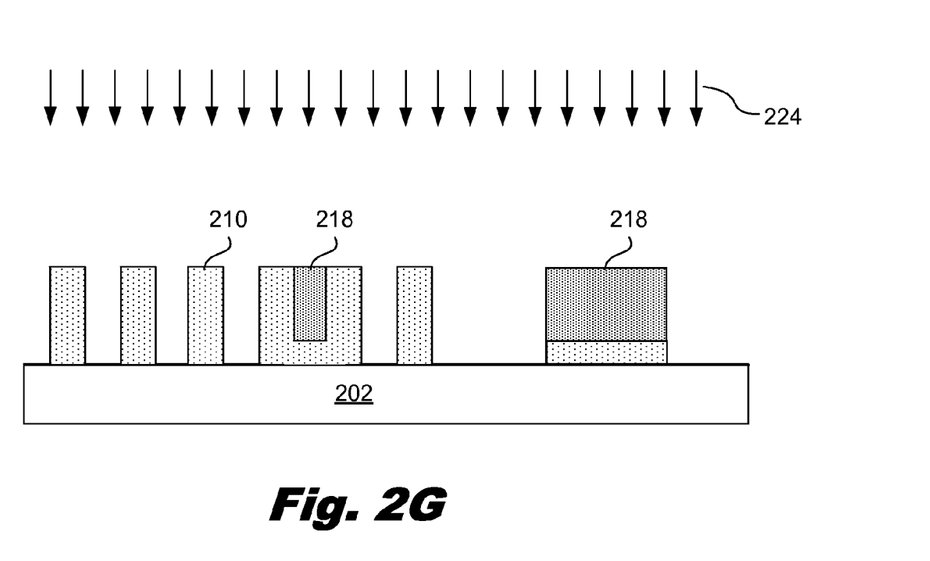

FIG. 2G illustrates a further removal process 124 to remove the spacer layer to expose the substrate 202 underneath. In one example, the removal process 224 removes a small part of the spacer layer. The removal process 224 is designed so that a small part of the spacer layer that is adjacent to the substrate is removed while the other layers remain substantially unaffected. For example, a removal process that removes a little bit from each layer may be used. Such a removal process can be applied long enough to remove the thin spacer layer that is adjacent to the substrate. While this process will remove a little bit from each of the other layers, it won't be enough to substantially affect the utility of such layers. After this removal process 224 is performed and the substrate is exposed. The remaining materials act as the final hard mask. Various lithographic processes may subsequently be performed on the substrate. For example, the regions of the substrate not protected by the final hard mask may be etched away to form trenches into the substrate. These trenches may then be filled with a metal material to form metal lines.

Figure 2H:
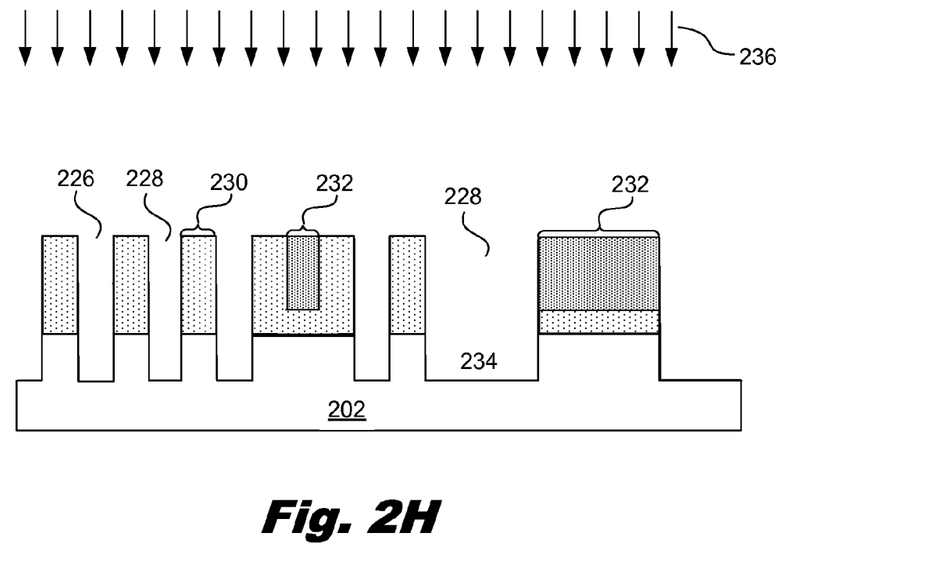

FIG. 2H illustrates an etching process 236 to form trenches 234 into the substrate after the final mask has been completed. In some examples, these trenches 234 may be subsequently filled in with metal to form metal lines within the substrate. In one example, a dry etching process with a CxFy base may be used. Through use of principles described herein, a self aligned double pattern final hard mask is created. This may be done in fewer steps and tolerate more alignment error than other methods.

The final features formed into the substrate after the final hard mask is complete are defined as follows. The trenches are defined by the features of the first resist layer 204 and the features of the second resist layer 212. Additionally, the space between features of the final pattern is defined by the spacer material and the hard mask material that is filled in between the features of the second resist layer 212.

Thus, the final hard mask includes spaces 226 formed by the features 206 of the first patterned resist layer 204, spaces 228 formed by features 214 of the second patterned resist layer 212, and areas between spaces formed by the spacer layer 230 or by regions 232 where the masking layer 218 was deposited between features 214 of the second patterned resist layer 212.

FIG. 3A-3F are diagrams showing an illustrative process for forming an integrated circuit using self aligned patterning in which the two masks that form two different resist layers use a different type of tone. The materials and etching process used in the following process may be similar to those of the above mentioned process. According to the present example, the first steps are as illustrated in FIGS. 2A-2B. The process differs in that the masking layer is deposited before the second resist layer is formed.

Figure 3A:
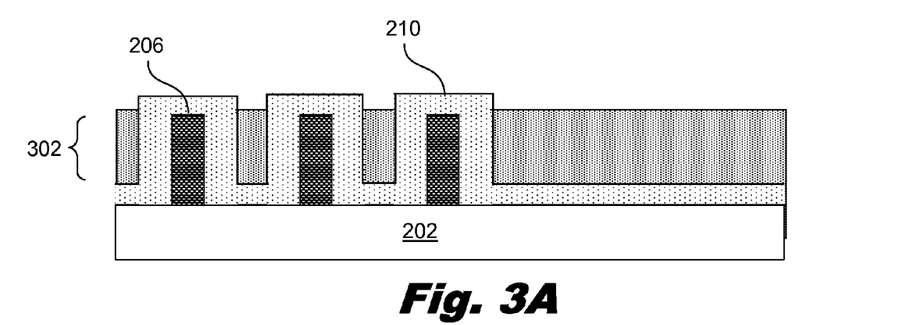
FIG. 3A-3F are diagrams showing an illustrative process for forming an integrated circuit using self aligned patterning with different mask tone types, according to one example of principles described herein.

FIG. 3A is a diagram showing the deposition of a masking layer 302 before formation of the second patterned resist layer. The masking layer 302 may be made from the same type of material as the masking layer discussed above in FIGS. 2A-2H. The masking layer 302 is made of a material that can be selectively etched from the spacer material 219.

Figure 3B:
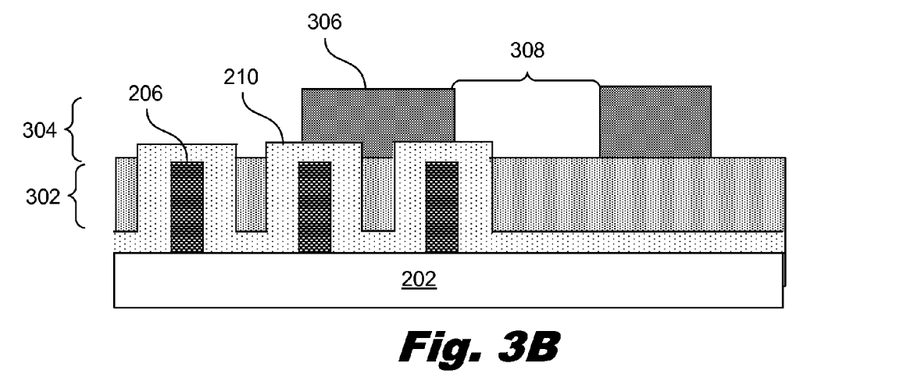

FIG. 3B is a diagram showing the formation of a second patterned resist layer 304 on top of the masking layer 302. In the present example, the mask used to pattern the second resist layer 304 is of a different mask tone type than the mask used to pattern the first resist layer 204. For example, in this case, the space 308 between regions 306 of resist material that remain after the second resist layer 304 has been patterned to define the features of the final pattern to be formed into the underlying substrate 202.

Figure 3C:
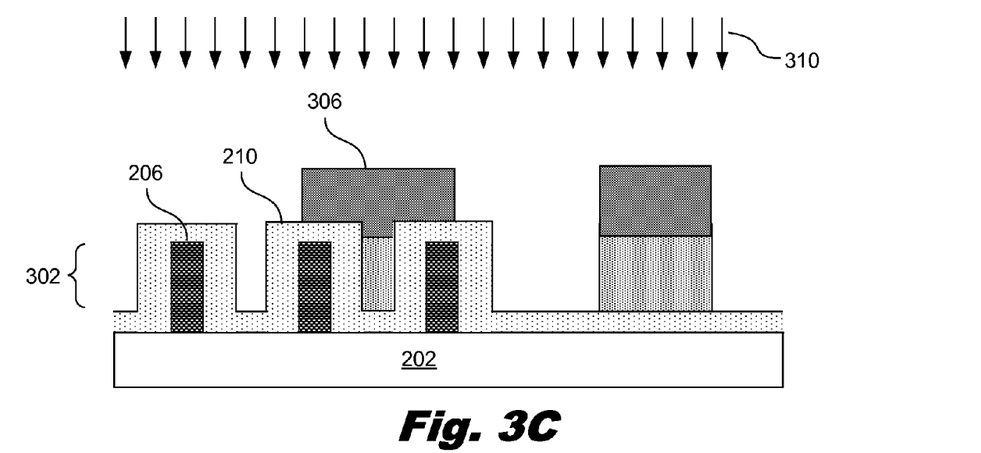

FIG. 3C is a diagram showing a removal process 310 used to remove regions of the masking layer that are not protected by the second patterned resist layer 304. Thus, the removal process 310 selectively removes the hard mask material that forms the masking layer 302 while leaving the second resist layer material intact.

Figure 3D:
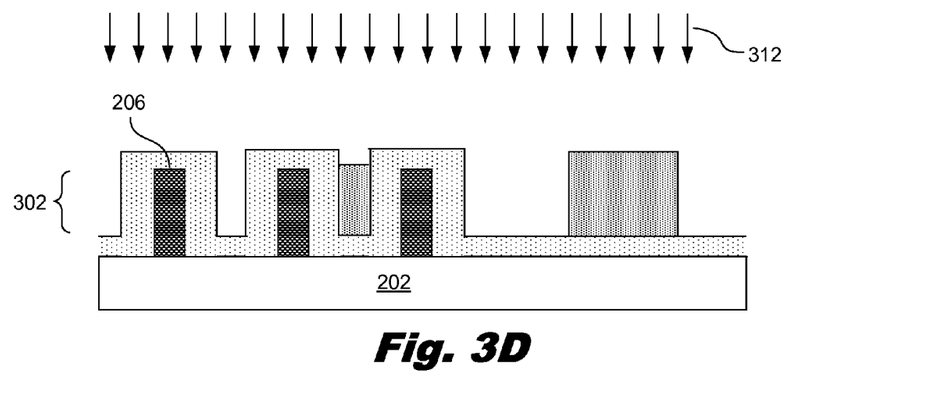

FIG. 3D is a diagram showing a removal process 312 used to remove the second resist layer 304. This removal process 312 is designed to selectively remove the second resist layer material while not removing the masking layer material or the spacer layer material.

Figure 3E:
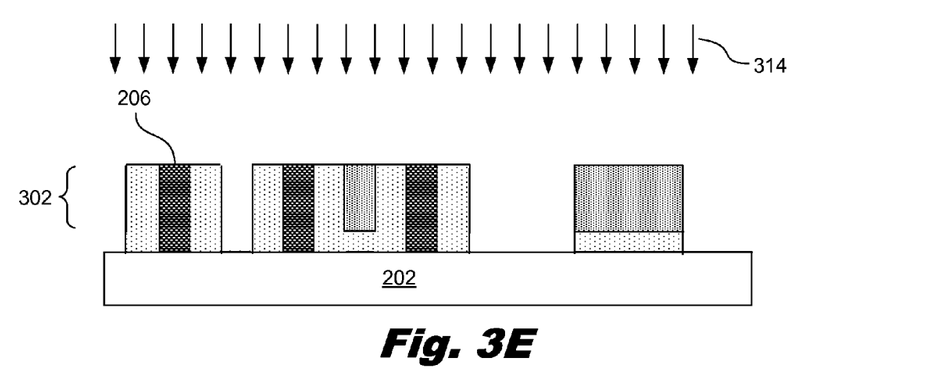
Figure 3F:
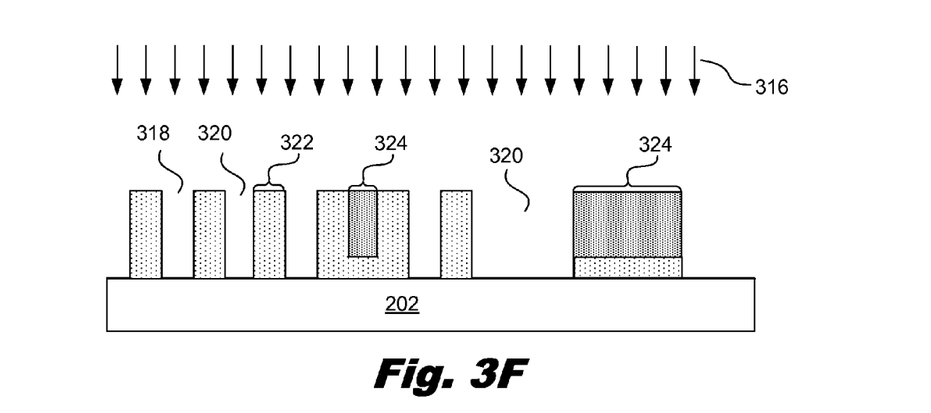

FIG. 3E is a diagram showing a planarizing process 314 used to remove each layer to expose the features 206 of the first resist layer. FIG. 3F is a diagram showing an illustrative removal process 316 to remove the first resist layer material. Additionally, the thin layer of spacer material on the substrate is removed to expose the substrate.

FIG. 3F illustrates the final hard mask pattern. The spaces in the hard mask pattern include spaces 318 resulting from the features 206 of the first resist layer 204 and spaces 320 resulting from spaces 308 in the second resist layer 304. Additionally, the regions between spaces include regions 322 resulting from the spacer layer and regions 324 where the features 306 of the second resist layer 304 protected the masking layer 302.

Thus, using the process described above in accordance with FIG. 3, the same final hard mask pattern that was formed by the process described in accordance with FIG. 2 is achieved. If such a hard mask pattern is used to form trenches for metal lines, then the metal lines are defined by the features of the first patterned resist layer and the space between features of the second patterned resist layer. Additionally, the space between metal lines is defined by the spacer layer and the features of the second patterned resist layer. Again, a larger alignment error may be tolerated without adversely affecting the pattern.

Figure 4:
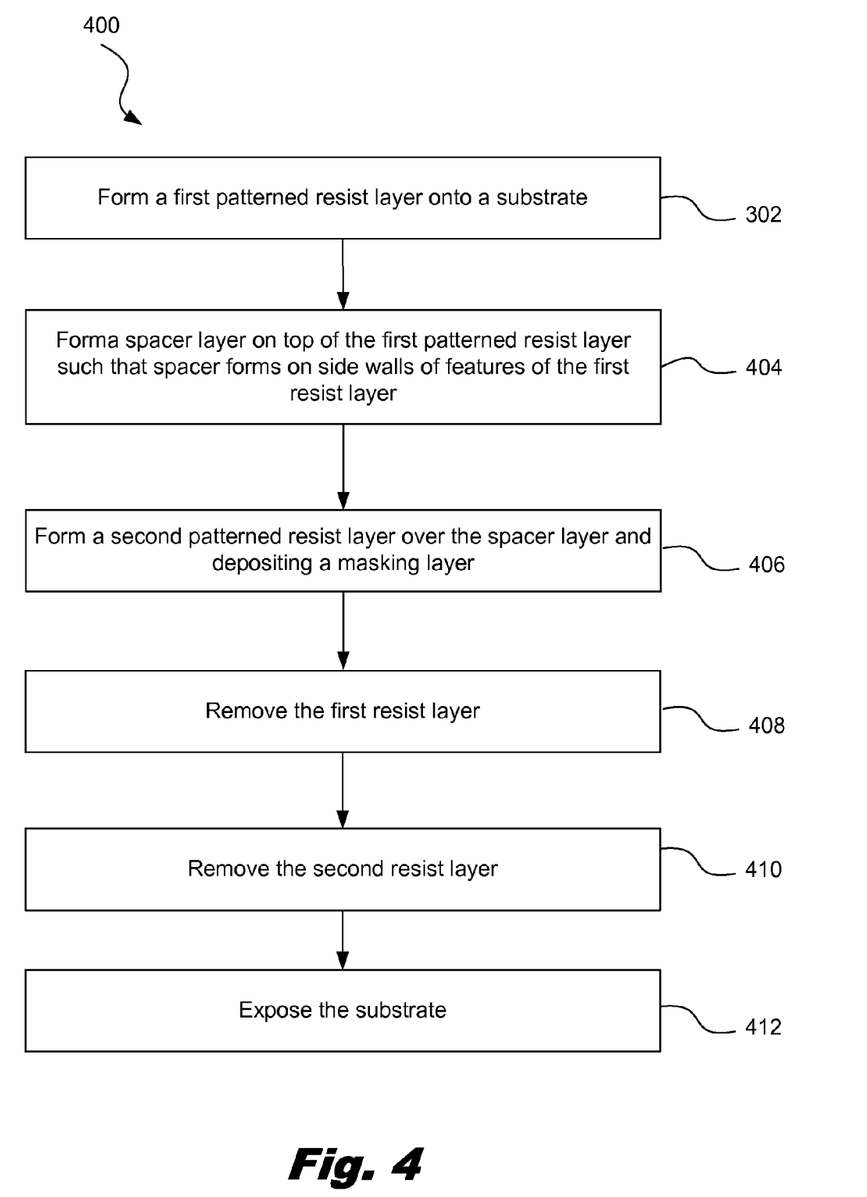
FIG. 4 is a flowchart showing an illustrative method for using self aligned multiple patterning with multiple resist layers, according to one example of principles described herein.

FIG. 4 is a flowchart showing an illustrative method 400 for using self aligned multiple patterning using multiple resist layers. According to the present example, the method 400 includes a step of forming 402 a first patterned resist layer onto a substrate. The method also includes a step of forming 404 a spacer layer on top of the first patterned resist layer such that spacer forms on side walls of features of the first resist layer. The method also includes a step of forming 406 a second patterned resist layer over the spacer layer and depositing a masking layer. The method also includes a step of removing 408 the first resist layer. The method also includes a step of removing 410 the second resist layer. The method also includes a step of exposing 412 the substrate.

According to certain illustrative examples, a method for using self aligned multiple patterning with multiple resist layers includes forming a first patterned resist layer onto a substrate, forming a spacer layer on top of the first patterned resist layer such that spacer forms on side walls of features of the first resist layer, and forming a second patterned resist layer over the spacer layer and depositing a masking layer. The method further includes removing the first resist layer, removing the second resist layer, and exposing the substrate.

According to certain illustrative examples, a method for forming a fabricated circuit includes forming a first patterned resist layer onto a substrate, forming a spacer layer on top of the first patterned resist layer such that spacer forms on side walls of features of the first resist layer, forming a second patterned resist layer over the spacer layer, and depositing a masking layer on the second resist layer. The method further includes performing a planarizing process to expose the first patterned resist layer, removing the first resist layer and the second resist layer, and exposing the substrate.

According to certain illustrative examples, a method for forming a fabricated circuit includes forming a first patterned resist layer onto a substrate, forming a spacer layer on top of the first patterned resist layer such that spacer forms on side walls of features of the first resist layer, and depositing a masking layer on the spacer layer. The method further includes forming a second patterned resist layer on the masking layer, etching away regions of the masking layer not covered by the second resist pattern features, removing the second resist layer, performing a planarizing process to expose the first patterned resist layer, removing the first resist layer, and exposing the substrate.

It is understood that various different combinations of the above-listed embodiments and steps can be used in various sequences or in parallel, and there is no particular step that is critical or required. Additionally, although the term "electrode" is used herein, it will be recognized that the term includes the concept of an "electrode contact." Furthermore, features illustrated and discussed above with respect to some embodiments can be combined with features illustrated and discussed above with respect to other embodiments. Accordingly, all such modifications are intended to be included within the scope of this invention.

The foregoing has outlined features of several embodiments. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions and alterations herein without departing from the spirit and scope of the present disclosure.

What is claimed is:

1. A method for fabricating an integrated circuit, the method comprising:
    forming a first patterned resist layer onto a substrate;
    forming a spacer layer over the first patterned resist layer such that spacer forms on side walls of features of the first patterned resist layer;
    forming a second patterned resist layer over the spacer layer and depositing a masking layer;
    removing a portion of the second patterned resist layer to expose the first patterned resist layer;
    removing the remaining first and second resist layers; and
    exposing the substrate.

2. The method of claim 1, wherein the first resist layer and the second resist layer are formed using a same type of mask tone.

3. The method of claim 2, wherein the second resist layer is formed before depositing the masking layer.

4. The method of claim 1, wherein the first resist layer and the second resist layer are formed using a different type of mask tone.

5. The method of claim 4, wherein the masking layer is deposited before the second resist layer is formed.

6. The method of claim 5, further comprising, etching the masking layer away in regions not covered by the features of the second resist layer before removing the second resist layer.

7. The method of claim 1, wherein depositing the masking layer occurs after forming the second patterned resist layer such that the masking layer physically contacts a portion of the second patterned resist layer and a portion of the spacer layer.

8. The method of claim 1, wherein removing the portion of the second patterned resist layer to expose the first patterned resist layer includes removing a portion of the spacer layer.

9. The method of claim 1, wherein the first patterned resist layer includes a top surface facing away from the substrate, and
   wherein forming the spacer layer over the first patterned resist layer includes forming the spacer layer directly on the top surface of the first patterned resist layer such that the spacer layer physically contacts the top surface of the first patterned resist layer.

10. A method for forming a fabricated circuit, the method comprising:
    forming a first patterned resist layer onto a substrate;
    forming a spacer layer on top of the first patterned resist layer such that spacer forms on side walls of features of the first resist layer;
    forming a second patterned resist layer over the spacer layer;
    depositing a masking layer on the second resist layer;
    performing a planarizing process to expose the first patterned resist layer; and
    removing the first patterned resist layer and the second patterned resist layer to expose a portion of the substrate.

11. The method of claim 10, further comprising, performing a lithographic process on the substrate.

12. The method of claim 10, wherein the resist material can be selectively etched from the masking layer material and the spacer layer material.

13. The method of claim 10, wherein removing the first resist layer and the second resist layer includes completely removing the first resist layer and the second resist layer after performing the planarizing process to expose the first patterned resist layer;
    removing the first resist layer and the second resist layer.

14. A method for forming a fabricated circuit, the method comprising:
    forming a first patterned resist layer onto a substrate;
    forming a spacer layer on top of the first patterned resist layer such that spacer forms on side walls of features of the first resist layer;
    depositing a masking layer on the spacer layer;
    forming a second patterned resist layer on the masking layer;
    etching away regions of the masking layer not covered by the second patterned resist layer;
    removing the second patterned resist layer;
    performing a planarizing process to expose the first patterned resist layer; and
    removing the first patterned resist layer to expose a portion of the substrate.

15. The method of claim 14, further comprising, performing a lithographic process on the substrate.

16. The method of claim 14, wherein the resist material is selectively etched from the masking layer material and the spacer layer material.

17. The method of claim 14, wherein the first patterned resist layer and the second patterned resist layer are formed using a different type of mask tone.

18. The method of claim 14, wherein a portion of the masking layer is disposed over the spacer layer after removing the first patterned resist layer to expose a portion of the substrate.

* * * * *